(12) United States Patent
Saito et al.

(10) Patent No.: US 8,722,791 B2
(45) Date of Patent: May 13, 2014

(54) POLYVINYLIDENE FLUORIDE RESIN COMPOSITION, FILM, BACK SHEET, AND SOLAR CELL MODULE

(75) Inventors: Tomoo Saito, Isesaki (JP); Fukumu Komoda, Isesaki (JP); Koji Nakajima, Isesaki (JP); Takashi Mitsumata, Isesaki (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 146 days.

(21) Appl. No.: 13/501,276

(22) PCT Filed: Nov. 11, 2010

(86) PCT No.: PCT/JP2010/070088
§ 371 (c)(1),
(2), (4) Date: Apr. 11, 2012

(87) PCT Pub. No.: WO2011/065234
PCT Pub. Date: Jun. 3, 2011

(65) Prior Publication Data
US 2012/0196971 A1    Aug. 2, 2012

(30) Foreign Application Priority Data

Nov. 30, 2009  (JP) ................................. 2009-271572
Nov. 30, 2009  (JP) ................................. 2009-271573

(51) Int. Cl.
*C08L 27/00*   (2006.01)
*C08K 5/00*    (2006.01)
(52) U.S. Cl.
USPC ........................................ 524/520; 524/515
(58) Field of Classification Search
USPC ........................................ 524/520
See application file for complete search history.

(56) References Cited

U.S. PATENT DOCUMENTS

| 4,770,939 A * | 9/1988 | Sietses et al. ................. 428/402 |
| 6,407,329 B1 | 6/2002 | Iino et al. |
| 2011/0293945 A1 | 12/2011 | Yoshimura et al. |

FOREIGN PATENT DOCUMENTS

| EP | 2397519 A1 | 12/2011 |
| JP | 64-090733 A | 4/1989 |
| JP | 02-022352 A | 1/1990 |
| JP | 07-090152 A | 4/1995 |
| JP | 11-207887 A | 8/1999 |
| JP | 2000-294813 A | 10/2000 |
| JP | 2008-028294 | 2/2008 |
| JP | 2008-028294 A | 2/2008 |
| JP | 2009-071236 | 4/2009 |
| JP | 2009-071236 A | 4/2009 |

OTHER PUBLICATIONS

International Search Report PCT/JP2010/070088 mailed Feb. 8, 2011.
European Search Report of EP application EP10833081.2 dated Apr. 11, 2013.

* cited by examiner

*Primary Examiner* — Hui Chin
(74) *Attorney, Agent, or Firm* — Roberts Mlotkowski Safran & Cole P.C.

(57) ABSTRACT

Provided is a polyvinylidene fluoride resin composition that has good inorganic pigment dispersivity.
Based on 100 parts by mass of a resin component containing two types of polyvinylidene fluorides having different forms or different melt flow characteristics in a total amount of 50 to 95% by mass and polymethyl methacrylate in an amount of 5 to 50% by mass, 7 to 40 parts by mass of a white inorganic pigment and 0.01 to 7 parts by mass of an inorganic pigment for toning are mixed to produce the resin composition. At that time, at least one of the two types of polyvinylidene fluorides to be used has an MFR (230° C., 3.8 kg load) of 3 to 35 g/10 min and the polymethyl methacrylate to be used has an MFR (230° C., 10 kg load) of 2 to 20 g/10 min.

9 Claims, No Drawings

POLYVINYLIDENE FLUORIDE RESIN COMPOSITION, FILM, BACK SHEET, AND SOLAR CELL MODULE

TECHNICAL FIELD

The present invention relates to a polyvinylidene fluoride resin composition, a polyvinylidene fluoride resin film, a back sheet for a solar cell module, and a solar cell module. More specifically, it relates to a resin composition for forming a weather resistant film constituting a back sheet for a solar cell module and to a weather resistant film formed by using the resin composition.

BACKGROUND ART

Polyvinylidene fluoride (hereinafter, abbreviated as PVDF) is excellent in mechanical strength and chemical resistance and is used as a pipe line material and a lining material for inner surfaces of a storage tank and a reaction container in chemical plants. PVDF is also excellent in weather resistance and thus is used as interior and exterior plastic plates for various architectures and automobiles, a surface protection film for a substrate such as a metal plate, and an insulating material for a member in electric and electronic equipment.

In recent years, PVDF has been drawing attention as a material for a weather resistant film constituting a back sheet of a photovoltaic power generation module (for example, see Patent Document 1). The solar cell module is required to have outdoor durability for a long time, and thus generally has an integrated structure in which a transparent substrate composed of glass or the like, a sealer composed of, for example, a sheet of a thermoplastic resin such as an ethylene vinyl acetate copolymer (EVA), a solar cell as a photovoltaic device, and a back sheet are stacked in this order and laminated by a method such as hot press.

The back sheet for a solar cell is used as the lowermost layer in a solar cell module in order to protect the solar cell and wiring, but is required to have an effect of increasing sunlight reflectivity for the increase of power generation efficiency of the solar cell module in addition to the protection effect. On this account, a conventional solar cell module mainly uses a white sheet, and the PVDF film for a solar cell generally contains a white pigment (for example, see Patent Document 2). Conventionally, in order to increase hiding power of the film, there is also disclosed a back sheet for a solar cell containing a slight amount of a colored inorganic pigment for toning in addition to the white pigment (for example, see Patent Document 3).

CITATION LIST

Patent Literature

[Patent Document 1] Japanese Unexamined Patent Application Publication No. 2000-294813
[Patent Document 2] Japanese Unexamined Patent Application Publication No. 2009-71236
[Patent Document 3] Japanese Unexamined Patent Application Publication No. 2008-28294

SUMMARY OF INVENTION

Technical Problem

In the solar cell module, the entering of water vapor, oxygen, other corrosive gases, and the like causes wiring corrosion or functional reduction of the solar cell, and hence the back sheet is also required to have performances such as water vapor barrier properties and gas barrier properties in addition to the long-term weather resistance, heat resistance, and the like. However, the conventional white PVDF film described above has poor dispersivities of a white pigment such as titanium oxide and an inorganic pigment for toning, and such a pigment is agglomerated to be likely to cause a defect in the film.

Then, when a back sheet has the defect, from the defect, moisture, oxygen, a corrosive gas, and the like in the atmosphere enter into the solar cell module to cause wiring corrosion, functional reduction of the solar cell, poor insulation, and the like. Furthermore, such a defective part reduces mechanical strength and flexibility, and hence, the film is torn from the defect as a starting point.

On this account, the present invention has a main object to provide a polyvinylidene fluoride resin composition that has good inorganic pigment dispersivity and that is unlikely to cause a defect due to poor dispersion and has practical mechanical strength characteristics in a film to be formed, and a film, a back sheet, and a solar cell module.

Solution to Problem

The inventors of the present invention have carried out intensive studies in order to solve the problems and, as a result, have found that when a mixture of PVDF and polymethyl methacrylate (hereinafter, abbreviated as PMMA) is used as a resin component and two types of PVDFs having a comparatively high melt flowability are used in combination to form a film, poor dispersion of an inorganic pigment is remarkably improved to significantly reduce defects due to the poor dispersion, and the invention has been completed.

Namely, a polyvinylidene fluoride resin composition of the present invention includes 100 parts by mass of a resin component containing two types of polyvinylidene fluorides in a total amount of 50 to 95% by mass and polymethyl methacrylate in an amount of 5 to 50% by mass, 7 to 40 parts by mass of a white inorganic pigment, and 0.01 to 7 parts by mass of an inorganic pigment for toning. At least one of the two types of polyvinylidene fluorides has an MFR (melt flow rate) of 3 to 35 g/10 min determined at a temperature of 230° C. and a load of 3.8 kg in accordance with JIS K 7210, method A, and the polymethyl methacrylate has an MFR (melt flow rate) of 2 to 20 g/10 min determined at a temperature of 230° C. and a load of 10 kg in accordance with JIS K 7210, method A.

In the composition, one of the two types of polyvinylidene fluorides may be in a pellet form and the other may be in a powder form.

In that case, the polyvinylidene fluoride in a pellet form to be used has, for example, an average particle diameter (median diameter) of 1 to 6 mm determined by a dry sieving test in accordance with JIS K 0069, the polyvinylidene fluoride in a powder form to be used has, for example, an average particle diameter (median diameter) of 3 to 30 μm determined with a laser diffractometer in accordance with JIS Z 8825-1, and the polyvinylidene fluoride in a pellet form may be included at a ratio of 40 to 97% by mass and the polyvinylidene fluoride in a powder form may be included at a ratio of 3' to 60% by mass, in the whole polyvinylidene fluorides.

Alternatively, the composition may include the polyvinylidene fluoride having an MFR (melt flow rate) of 3 to 35 g/10 min determined at a temperature of 230° C. and a load of 3.8 kg in accordance with JIS K 7210, method A and a polyvinylidene fluoride having an MFR (melt flow rate) of 2 to 30 g/10 min determined at a temperature of 230° C. and a load of 10 kg in accordance with JIS K 7210, method A.

The white inorganic pigment to be used has, for example, an average particle diameter (median diameter) of 0.1 to 2 µm determined with a laser diffractometer in accordance with JIS Z 8825-1.

The inorganic pigment for toning to be used has, for example, an average particle diameter (median diameter) of 0.1 to 2 µm determined with a laser diffractometer in accordance with JIS Z 8825-1.

A polyvinylidene fluoride resin film of the present invention is obtained by melting and kneading the polyvinylidene fluoride resin composition at a temperature ranging from 150 to 260° C. and then by extrusion molding the melted and kneaded resin composition.

A back sheet for a solar cell module of the present invention is obtained by stacking the polyvinylidene fluoride resin film and a polyethylene terephthalate resin film.

A solar cell module of the present invention uses the back sheet.

Advantageous Effects of Invention

According to the present invention, two types of PVDFs are used in combination and at least one of the PVDFs has a comparatively high melt flowability. Therefore, such a composition can improve inorganic pigment dispersivity and can provide a polyvinylidene fluoride resin film that has few defects due to poor dispersion, excellent weather resistance, and practical mechanical strength characteristics and that is suitable for a back sheet for a solar cell module.

DESCRIPTION OF EMBODIMENTS

Embodiments for carrying out the present invention will be described in detail hereinafter. The embodiments described below are merely examples for typical embodiments of the present invention and are not intended to limit the scope of the invention.

First Embodiment

First, a polyvinylidene fluoride resin composition (hereinafter, also simply referred to as a resin composition) of a first embodiment of the present invention will be described. The resin composition of the present embodiment includes at least a white inorganic pigment and an inorganic pigment for toning in addition to a resin component containing two types of PVDFs in different forms and PMMA.

[PVDF: a Total Amount of 50 to 95% by Mass in the Resin Component]

PVDF is excellent in weather resistance and heat resistance and is a main component in the resin composition of the embodiment. However, the resin composition that contains two types of PVDFs both having an MFR of less than 3 g/10 min reduces dispersivities of the white inorganic pigment and the inorganic pigment for toning with respect to the PVDFs and is likely to cause defects in a film to be formed. On the other hand, the resin composition that contains two types of PVDFs both having an MFR of more than 35 g/10 min reduces mechanical characteristics such as tensile strength of a film to be formed and also reduces moldability.

Thus, the resin composition of the embodiment uses, for one or both of PVDFs, a resin having an MFR (melt flow rate) of 3 to 35 g/10 min determined at a temperature of 230° C. and a load of 3.8 kg in accordance with JIS K 7210, method A. The PVDF preferably has an MFR of 5 to 30 g/10 min and more preferably 10 to 25 g/10 min. Such a resin composition can remarkably improve the dispersivities of the white inorganic pigment and the inorganic pigment for toning, is unlikely to cause defects in a film to be formed, and can improve the mechanical characteristics of the film.

In the resin composition of the embodiment, it is desirable that one of the two types of PVDFs is in a pellet form and the other is in a powder form. Such a combination use of the pellet form and the powder form can achieve high shear force that is required for highly dispersing pigments during a melting process of material resins in a melting and kneading (compound) step.

At that time, the pellet form to be used desirably has an average particle diameter (median diameter) of 1 to 6 mm determined by dry sieving test in accordance with JIS K 0069, "Test methods for sieving of chemical products". The powder form to be used desirably has an average particle diameter (median diameter) of 3 to 30 µm determined with a laser diffractometer in accordance with JIS Z 8825-1, "Particle size analysis-Laser diffraction methods-Part 1: General principles". Such a resin composition can increase the shear force during the melting process without reducing handling properties.

In the resin composition of the embodiment, it is preferable that the pellet form is contained at a ratio of 40 to 97% by mass and the powder form is contained at a ratio of 3 to 60% by mass in the whole PVDFs. The resin composition containing the pellet form at an increased ratio and the powder form at a ratio of less than 3% by mass in the whole may achieve insufficient dispersion and mixing of the PVDFs with the white inorganic pigment and the inorganic pigment for toning and may give a heterogeneous composition. Conversely, the resin composition containing the pellet form at a reduced ratio and the powder form at a ratio of more than 60% by mass in the whole completes the melting of PVDFs in a short period during the heating and kneading. Thus, the white inorganic pigment and the inorganic pigment for toning may be insufficiently dispersed and mixed to give an aggregate of the pigments. It is more preferable that the pellet form is contained in a range of 60 to 80% by mass and the powder form is contained in a range of 20 to 40% by mass in the whole PVDFs.

The resin composition of the embodiment may contain any PVDF as long as the MFR is within the range above and a commercially available resin may be used. Specifically, the resin is preferably a homopolymer of vinylidene fluoride but may be a copolymer copolymerized from vinylidene fluoride as a main component and another fluorine-containing monomer in a range of 50% by mass or less. Examples of the fluorine-containing monomer that forms a copolymer with vinylidene fluoride include known fluorine-containing monomers such as hexafluoropropylene, tetrafluoroethylene, hexafluoroisobutylene, and various fluoroalkyl vinyl ethers.

A method for producing these resins is not specifically limited. The polymerization is carried out by a common method such as suspension polymerization and emulsion polymerization. Typically, for example, the resin can be produced by a method in which a solvent such as water, a polymerization initiator, a suspending agent (or an emulsifier), a chain transfer agent, and the like are placed in a closed reactor, then the reactor is decompressed by degassing, a gaseous vinylidene fluoride monomer is placed, and the vinylidene fluoride monomer is polymerized while controlling the reaction temperature.

At that time, as the polymerization initiator, an inorganic peroxide such as a persulfate or an organic peroxide is commonly used, and examples include di-normal-propyl peroxydicarbonate (NPP) and diisopropyl peroxydicarbonate.

Examples of the chain transfer agent include acetone, isopropyl acetate, ethyl acetate, diethyl carbonate, dimethyl carbonate, ethyl carbonate, propionic acid, trifluoroacetic acid, trifluoroethyl alcohol, β-formaldehyde dimethyl acetal, 1,3-butadiene epoxide, 1,4-dioxane, -butyrolactone, ethylene carbonate, and vinylene carbonate. Specifically, acetone, ethyl acetate, and the like are suitably used due to easy availability and easy handling.

Examples of the suspending agent (emulsifier) include a partially saponified polyvinyl alcohol, water-soluble cellulose ethers such as methyl cellulose and hydroxyethyl cellulose, an acrylic acid polymer, and water-soluble polymers such as gelatin.

The MFR of the PVDF can be controlled by, for example, polymerization temperature, the type and amount of the polymerization initiator, and the type and amount of the chain transfer agent. For example, when the type of the polymerization initiator is the same as that of the chain transfer agent, a higher polymerization temperature can increase the MFR.

In the resin composition of the embodiment, the total ratio of PVDFs including a pellet form and a powder form is 50 to 95% by mass in the resin component. The resin composition containing PVDFs at a ratio of less than 50% by mass reduces the dispersion of the pigments and is likely to cause defects in a film to be formed. On the other hand, the resin component containing PVDFs at a ratio of more than 95% by mass reduces mechanical characteristics such as film strength. In the resin component, the compounding ratio of PVDFs is preferably 50 to 90% by mass (PMMA: 10 to 50% by mass) and more preferably 60 to 85% by mass (PMMA: 15 to 40% by mass).

[PMMA: an Amount of 5 to 50% by Mass in the Resin Component]

The combination use of PMMA with PVDF can impart adhesiveness required for lamination with another substrate when the resin component is processed into a film and the like. However, the resin component containing PMMA in an amount of less than 5% by mass may provide insufficient adhesiveness or may reduce mechanical characteristics such as film strength. On the other hand, the resin component containing PMMA in an amount of more than 50% by mass may reduce weather resistance of a film itself and may achieve insufficient weather resistance for a back sheet of a solar cell. Hence, the resin component contains PMMA in an amount of 5 to 50% by mass.

The PMMA contained in the resin composition of the embodiment is not specifically limited, but is preferably a resin that has excellent weather resistance mainly containing methyl methacrylate produced by, for example, an ACH method, a modified ACH method, a direct method, and an ethylene method. Examples of the monomer copolymerizable with methyl methacrylate include ethyl (meth)acrylate, 2-propyl (meth)acrylate, and n-propyl (meth)acrylate. For imparting flexibility, butyl (meth)acrylate and 2-ethylhexyl (meth)acrylate are exemplified.

The PMMA used in the resin composition of the embodiment has an MFR (melt flow rate) of 2 to 20 g/10 min determined at a temperature of 230° C. and a load of 10 kg in accordance with JIS K 7210, method A. The PMMA having an MFR within the range has good compatibility with PVDF. Hence, such a resin composition does not cause defects by resin segregation in a film to be formed and can impart moderate strength and flexibility to the film. The PMMA preferably has MFR of 4 to 15 g/10 min and more preferably 6 to 12 g/10 min.

[White Inorganic Pigment: an Amount of 7 to 40 Parts by Mass Based on 100 Parts by Mass of the Resin Component]

The white inorganic pigment is contained in order to secure hiding properties that are required for a film used, for example, for a back sheet for a solar cell module. However, the resin composition containing the white inorganic pigment in an amount of less than 7 parts by mass base on 100 parts by mass of the resin component cannot achieve sufficient hiding properties or reflectance of visible light. The resin composition containing the white inorganic pigment in an amount of more than 40 parts by mass base on 100 parts by mass of the resin component may reduce mechanical strength of a film to be formed or may cause many appearance defects due to poor dispersion. Hence, the white inorganic pigment is contained in an amount of 7 to 40 parts by mass based on 100 parts by mass of the resin component containing PVDF and PMMA.

The white inorganic pigment is preferably contained in an amount of 10 to 35 parts by mass and more preferably 15 to 30 parts by mass base on 100 parts by mass of the resin component. Such a resin composition can provide a film having a large total reflectance of visible light, moderate mechanical strength and flexibility, and good handling properties.

The white inorganic pigment preferably has an average particle diameter (median diameter) of 0.1 to 2 μm and more preferably 0.20 to 1 μm determined with a laser diffractometer in accordance with JIS Z 8825-1. Such a white inorganic pigment achieves good dispersivity during the melting and kneading and can afford a film with few appearance defects.

Examples of the material of the white inorganic pigment contained in the resin composition of the embodiment include, but are not necessarily limited to, magnesium oxide, barium sulfate, titanium oxide, basic lead carbonate, and zinc oxide. Among various white inorganic pigments, in particular, a rutile-type crystalline titanium dioxide is desirably used because it has large refractive index, large coloring power, and small photocatalytic action.

The white inorganic pigment is further preferably a titanium oxide having a particle surface coated with alumina and/or silica. Such a white inorganic pigment has better dispersivity to a film, can prevent thermal decomposition of PVDF by catalytic action during heating and kneading in the production process of the resin composition and during film formation, and can further suppress light deterioration to secure the weather resistance when a film is used outdoors.

[Inorganic Pigment for Toning: an Amount of 0.01 to 7 Parts by Mass Based on 100 Parts by Mass of the Resin Component]

The inorganic pigment for toning is contained in order to finely control a color tone and to improve heat resistance of a film to be formed. However, the resin composition containing the inorganic pigment for toning in an amount of less than 0.01 parts by mass base on 100 parts by mass of the resin component cannot achieve sufficient coloring power or heat resistance improvement effect. On the other hand, the resin composition containing the inorganic pigment for toning in an amount of more than 7 parts by mass base on 100 parts by mass of the resin component is difficult to uniformly disperse the inorganic pigment in the resin and increases appearance defects of a film. Hence, the inorganic pigment for toning is contained in an amount of 0.01 to 7 parts by mass based on 100 parts by mass of the resin component containing PVDF and PMMA. The inorganic pigment for toning is preferably contained in an amount of 0.1 to 5 parts by mass and more preferably 0.5 to 3 parts by mass base on 100 parts by mass of the resin component.

The inorganic pigment for toning preferably has an average particle diameter of 0.1 to 2 μm and more preferably 0.20 to 1 μm in order to achieve sufficient coloring power and hiding properties and to suppress the formation of particle aggregation. Here, the average particle diameter is a median diameter determined with a laser diffractometer in accordance with JIS Z 8825-1.

The material of the inorganic pigment for toning contained in the resin composition of the embodiment is not specifically limited, and usable examples of the material include composite oxide pigments of solid solutions by burning of several oxides selected from oxides of chromium, zinc, iron, nickel, aluminum, cobalt, manganese, copper, and the like. One or more of the composite oxide pigments may also be used as a mixture.

The inorganic pigment for toning preferably has a surface coated with a silane coupling agent before combination. At that time, various silane coupling agents may be used. In particular, n-hexylmethoxysilane having a hexyl group as a reactive functional group and a methoxy group as a hydrolyzable group is effective in the suppression of defects in a film to be formed.

[Production Method]

The resin composition of the embodiment can be obtained by, for example, melting and kneading the PVDF in a pellet form, the PVDF in a powder form, the PMMA, the white inorganic pigment, the inorganic pigment for toning, and the like by a common method. The kneading method is not specifically limited, but can use various mixers and kneaders equipped with a heater, such as a twin screw extruder, a continuous kneader, and a batch-wise kneader. A best suited apparatus for melting and kneading is a twin screw extruder from the viewpoint of versatility.

[Film]

The resin composition of the embodiment can provide a polyvinylidene fluoride resin film as it is melted and kneaded at a temperature ranging from 150 to 260° C. and then extrusion molded. The film formation method is not specifically limited, and the film can be formed by a common method but is preferably formed with an extruder using a T die for film. At that time, for the material for feeding, the melted and kneaded resin composition prepared by the method above may be used. Alternatively, corresponding materials may be mixed to be directly fed to a single screw or twin screw extruder, then melted and kneaded, and extrusion molded through the T die for film to form a film.

However, the melting and kneading at a temperature of less than 150° C. may afford an insufficient amount of heat for the melting of the PVDF, while the melting and kneading at a temperature of more than 260° C. may decompose the PVDF by heat. Thus, the temperature during melting and kneading is in a range from 150 to 260° C.

[Back Sheet]

The polyvinylidene fluoride resin film formed by the method above can be stacked on and laminated with a polyethylene terephthalate (PET) film to provide a back sheet for a solar cell module. For the lamination of these films, various adhesives can be used for adhesion.

The back sheet can be suitably used for a solar cell module. When the back sheet is used for a solar cell module, the back sheet is required to be laminated with a so-called sealer that is a sheet of a thermoplastic resin such as EVA. The back sheet using the film composed of the resin composition of the embodiment can be laminated by hot press at 100 to 150° C.

As described above in detail, the resin composition of the embodiment uses two types of PVDFs in different forms such as a pellet form and a powder form and one or both of the PVDFs have an MFR of 3 to 35 g/10 min. Thus, the resin composition can provide high shear force that is required to highly disperse the pigments in a melting and kneading step. As a result, such a resin composition can improve the dispersivities of the white inorganic pigment and the inorganic pigment for toning and can provide a film that has few defects due to poor dispersion and that is excellent in weather resistance and mechanical strength characteristics.

Second Embodiment

Next, a polyvinylidene fluoride resin composition of a second embodiment of the present invention will be described. The resin composition of the present embodiment is the same as the resin composition of the first embodiment above except that two types of PVDFs having different melt flow characteristics are contained.

[PVDF: a Total Amount of 50 to 95% by Mass in the Resin Component]

The resin composition of the embodiment uses two types of PVDFs (PVDF1 and PVDF2) having different melt flow characteristics. These resins may be in a pellet form, in a powder form, or a mixture of them. The melt flow characteristics of each material resin component below are determined by a measurement method for MFR (melt flow rate) in accordance with JIS K 7210, method A, unless otherwise specified.

One (PVDF1) of two types of PVDFs to be used has an MFR of 3 to 35 g/10 min, preferably 5 to 30 g/10 min, and more preferably 10 to 25 g/10 min, determined at a temperature of 230° C. and a load of 3.8 kg. The other (PVDF2) to be used has an MFR of 2 to 30 g/10 min, preferably 10 to 27 g/10 min, and more preferably 15 to 25 g/10 min, determined at a temperature of 230° C. and a load of 10 kg.

PVDF2 has a remarkably low MFR, which is not within the range in accordance with JIS above under the same measurement condition as that in PVDF1. Hence, the measured value is shown under a condition at a higher load. Here, for the comparison under the same condition, PVDF1 having an MFR of 3 to 35 g/10 min at a temperature of 230° C. and a load of 3.8 kg has an MFR of 50 to 160 g/10 min at a temperature of 230° C. and a load of 10 kg.

The use of two types of PVDF resins having different melt flow characteristics as above can improve the dispersivity of the inorganic pigment when the composition is melted and kneaded. However, the use of PVDF1 having an MFR of less than 3 g/10 min at a temperature of 230° C. and a load of 3.8 kg reduces the dispersivity of the inorganic pigment in the resin composition and is likely to cause defects in a film to be formed. The use of PVDF1 having an MFR of more than 35 g/10 min under this condition reduces the dispersivity of the inorganic pigment as well as tensile strength of a film to be formed.

Meanwhile, the use of PVDF2 having a lower melt flow characteristics and having an MFR of less than 2 g/10 min at a temperature of 230° C. and a load of 10 kg remarkably reduces the dispersivity of the inorganic pigment and causes a lot of defects in a film. The use of PVDF2 having an MFR of more than 30 g/10 min in this condition reduces the tensile strength of a film.

When one of PVDF1, PVDF2, and PMMA has a ratio out of the range above, a film to be formed has a lot of defects. The resin component containing PMMA in an amount of more than 50% by mass provides a film having insufficient characteristics as a weather resistant film as well as remarkably reduced tensile strength.

As described above, the resin composition of the embodiment uses two types of PVDFs having different melt flow characteristics and each MFR is within a specific range. Hence, the resin composition can improve the dispersivities of the white inorganic pigment and the inorganic pigment for toning. Such a resin composition can provide a film having few defects due to poor dispersivity and having excellent weather resistance and mechanical strength characteristics. In particular, when one of the two types of PVDFs having different melt flow characteristics is in a pellet form and the other is in a powder form, the dispersivities of the pigments can be further improved to provide a film with very few defects.

The resin composition of the present embodiment has the same structure and advantages as those in the first embodiment except for the above.

EXAMPLES

The advantageous effect of the present invention will be described hereinafter with reference to examples and comparative examples of the invention. The present invention is not limited to the examples. First, as a first example of the present invention, a polyvinylidene fluoride resin composition using two types of PVDFs in different forms was prepared and film characteristics of the composition was evaluated.

Example 1

(1) Preparation of Inorganic Pigment for Toning

In a dry mixer, 0.8 kg of black inorganic pigment powder composed of solid solution of oxides of chromium, manganese, and copper, 1.6 kg of brown pigment powder composed of solid solution of oxides of zinc, iron, nickel, and aluminum, and 0.6 kg of blue pigment powder composed of cobalt aluminate were mixed to produce an inorganic pigment for toning. Next, to a mixed solution of 0.3 kg of 0.1% by mass of an aqueous acetic acid solution and 0.3 kg of ethanol, 0.03 kg of n-hexyltrimethoxysilane was added to prepare a silane coupling agent solution. Then, the inorganic pigment for toning was placed in a mixer, and the silane coupling agent solution was added dropwise while stirring the pigment, and mixed. After mixing, the mixture was taken out, dried with a dryer, and pulverized to make a powder. The obtained inorganic pigment for toning had an average particle diameter (median diameter) of 0.3 μm.

(2) Resin Component

For the resin component, resins each having the following physical properties were used. MFR was determined by the measurement method in accordance with JIS K 7210, method A. The average particle diameter (median diameter) of a pellet form was determined by the dry sieving test in accordance with JIS K 0069, "Test methods for sieving of chemical products", while that of a powder form was determined with a laser diffractometer in accordance with JIS Z 8825-1, "Particle size analysis-Laser diffraction methods-Part 1: General principles".
<PVDF (A)>
A polyvinylidene fluoride resin in a pellet form having an MFR (temperature: 230° C., load: 3.8 kg) of 20 g/10 min and an average particle diameter (median diameter) of 3 mm.
<PVDF (B)>
A polyvinylidene fluoride resin in a powder form having an MFR (temperature: 230° C., load: 3.8 kg) of 20 g/10 min and an average particle diameter (median diameter) of 10 μm.
<PMMA>
A polymethyl methacrylate resin having an MFR (temperature: 230° C., load: 10 kg) of 9 g/10 min.

(3) Preparation of Resin Composition

First, 3 kg of the inorganic pigment for toning surface-coated with the silane coupling agent and 20 kg of rutile-type crystalline titanium dioxide powder (median diameter: 0.3 μm) as a white inorganic pigment were mixed in a mixer.

Next, into a twin screw extruder having a screw diameter of 30 mm and L/D=40 as a kneader for the preparation of the resin composition, the inorganic pigment for toning, PVDF (A), PVDF (B), and PMMA were fed using corresponding quantitative feeders at a speed corresponding to the compounding ratio of each component and the whole was melted and kneaded. Then, the mixture was passed through a strand die including three holes each having a hole diameter of 3 mm to afford a resin composition in a pellet form. In the obtained resin composition, PVDF (A) was 60 parts by mass, PVDF (B) was 20 parts by mass, PMMA was 20 parts by mass, the white inorganic pigment was 20 parts by mass, and the inorganic pigment for toning was 3 parts by mass.

(4) Film Formation and Evaluation of Film Defect

The obtained resin composition was extruded with a film formation apparatus that was a single screw extruder having a screw diameter of 40 mm and L/D=30 and attached with a T die having a width of 400 mm at a screw rotation speed of 35 rpm and a barrel temperature of 240° C. to form a film having a film width of 300 mm and an average thickness of 18 μm. For the evaluation of the obtained film defect, the number of defects in an area of 50 $m^2$ in the roll up film (width 300 mm×length 2000 m) was evaluated using a defect detector. In the present example, as the evaluation standard of the number of defects, the number of defects having a size of 0.05 mm or more was counted in the film.

(5) Characteristics Evaluation of Film

The tensile strength of the obtained film was determined by the method in accordance with JIS K 7127. In the tensile strength measurement, the sample width was 10 mm and the chuck distance was 40 mm. In addition, the total reflectance of visible light was evaluated in accordance with JIS K 7105.

Examples 2, 3, and 8 to 14, Comparative Examples 1, 2, and 9 to 12

The evaluations were carried out in the same manner as in Example 1 except that the feed amount of each material component was controlled by a quantitative feeder to change the composition ratio of each component in the resin composition.

Examples 4 and 5, Comparative Examples 3 and 4

The evaluations were carried out in the same manner as in Example 1 except that the PVDF resins each having an MFR of 5 g/10 min, 33 g/10 min, 1 g/10 min, or 40 g/10 min at a temperature of 230° C. and a load of 3.8 kg were used as the PVDF (A) in a pellet form and the PVDF (B) in a powder form.

Examples 6 and 7, Comparative Examples 5 and 6

The evaluations were carried out in the same manner as in Example 1 except that resins each having an MFR of 4 g/10 min, 18 g/10 min, 1 g/10 min, or 25 g/10 min at a temperature of 230° C. and a load of 10 kg were used as the PMMA resin.

Comparative Example 7

The evaluation was carried out in the same manner as in Example 1 except that the PVDF (A) in a pellet form was not used and 80 parts by mass of the PVDF (B) in a powder form alone was used as the PVDF resin.

Comparative Example 8

The evaluation was carried out in the same manner as in Example 1 except that the PVDF (B) in a powder form was not used and 80 parts by mass of the PVDF (A) in a pellet form alone was used as the PVDF resin.

The evaluation results of the resin compositions of Examples 1 to 14 are summarized in Table 1, while the evaluation results of the resin compositions of Comparative Examples 1 to 12 are summarized in Table 2.

TABLE 1

|  |  | Example 1 | Example 2 | Example 3 | Example 4 | Example 5 | Example 6 | Example 7 |
|---|---|---|---|---|---|---|---|---|
| PVDF (A) pellets (particle diameter of 3 mm) | Mixing amount (parts by mass) | 60 | 38 | 69 | 60 | 60 | 60 | 60 |
|  | MFR (g/10 min) at a load of 3.8 kg | 20 | 20 | 20 | 5 | 33 | 20 | 20 |
| PVDF (B) powder (particle diameter of 10 μm) | Mixing amount (parts by mass) | 20 | 15 | 23 | 20 | 20 | 20 | 20 |
|  | MFR (g/10 min) at a load of 3.8 kg | 20 | 20 | 20 | 5 | 33 | 20 | 20 |
| Total PVDFs | Mixing amount (parts by mass) | 80 | 53 | 92 | 80 | 80 | 80 | 80 |
|  | (A)/(B) (% by mass) | 75/25 | 72/28 | 75/25 | 75/25 | 75/25 | 75/25 | 75/25 |
| PMMA | Mixing amount (parts by mass) | 20 | 47 | 8 | 20 | 20 | 20 | 20 |
|  | MFR (g/10 min) at a load of 10 kg | 9 | 9 | 9 | 9 | 9 | 4 | 18 |
| White inorganic pigment | Mixing amount (parts by mass) | 20 | 20 | 20 | 20 | 20 | 20 | 20 |
| Inorganic pigment for toning | Mixing amount (parts by mass) | 3 | 3 | 3 | 3 | 3 | 3 | 3 |
| Evaluation results | Tensile strength (MPa) | 51 | 45 | 55 | 43 | 58 | 55 | 41 |
|  | Tensile shear elongation (%) | 450 | 500 | 400 | 550 | 370 | 390 | 580 |
|  | Tensile shear elongation (%) | 200 | 250 | 270 | 150 | 240 | 150 | 180 |
|  | Total reflectance of visible light (%) | 75 | 75 | 75 | 75 | 75 | 73 | 75 |

|  |  | Example 8 | Example 9 | Example 10 | Example 11 | Example 12 | Example 13 | Example 14 |
|---|---|---|---|---|---|---|---|---|
| PVDF (A) pellets (particle diameter of 3 mm) | Mixing amount (parts by mass) | 32 | 77 | 60 | 60 | 60 | 60 | 24 |
|  | MFR (g/10 min) at a load of 3.8 kg | 20 | 20 | 20 | 20 | 20 | 20 | 20 |
| PVDF (B) powder (particle diameter of 10 μm) | Mixing amount (parts by mass) | 48 | 3 | 20 | 20 | 20 | 20 | 56 |
|  | MFR (g/10 min) at a load of 3.8 kg | 20 | 20 | 20 | 20 | 20 | 20 | 20 |
| Total PVDFs | Mixing amount (parts by mass) | 80 | 80 | 80 | 80 | 80 | 80 | 80 |
|  | (A)/(B) (% by mass) | 40/60 | 96/4 | 75/25 | 75/25 | 75/25 | 75/25 | 30/70 |
| PMMA | Mixing amount (parts by mass) | 20 | 20 | 20 | 20 | 20 | 20 | 20 |
|  | MFR (g/10 min) at a load of 10 kg | 9 | 9 | 9 | 9 | 9 | 9 | 9 |
| White inorganic pigment | Mixing amount (parts by mass) | 20 | 20 | 10 | 37 | 20 | 20 | 20 |
| Inorganic pigment for toning | Mixing amount (parts by mass) | 3 | 3 | 3 | 3 | 0.3 | 6 | 3 |
| Evaluation results | Tensile strength (MPa) | 53 | 48 | 60 | 45 | 51 | 50 | 50 |
|  | Tensile shear elongation (%) | 450 | 470 | 460 | 440 | 450 | 450 | 350 |
|  | Tensile shear elongation (%) | 280 | 250 | 210 | 400 | 200 | 380 | 480 |
|  | Total reflectance of visible light (%) | 75 | 75 | 65 | 80 | 60 | 75 | 75 |

TABLE 2

| | | Comparative example 1 | Comparative example 2 | Comparative example 3 | Comparative example 4 | Comparative example 5 | Comparative example 6 | Comparative example 7 | Comparative example 8 | Comparative example 9 | Comparative example 10 | Comparative example 11 | Comparative example 12 |
|---|---|---|---|---|---|---|---|---|---|---|---|---|---|
| PVDF (A) pellets (particle diameter of 3 mm) | Mixing amount (parts by mass) | 34 | 73 | 60 | 60 | 60 | 60 | 0 | 80 | 60 | 60 | 60 | 60 |
| | MFR (g/10 min) at a load of 3.8 kg | 20 | 20 | 1 | 40 | 20 | 20 | — | 20 | 20 | 20 | 20 | 20 |
| PVDF (B) powder (particle diameter of 10 μm) | Mixing amount (parts by mass) | 11 | 25 | 20 | 20 | 20 | 20 | 80 | 0 | 20 | 20 | 20 | 20 |
| | MFR (g/10 min) at a load of 3.8 kg | 20 | 20 | 1 | 40 | 20 | 20 | 20 | — | 20 | 20 | 20 | 20 |
| Total PVDFs | Mixing amount (parts by mass) | 45 | 98 | 80 | 80 | 80 | 80 | 80 | 80 | 80 | 80 | 80 | 80 |
| | (A)/(B) (% by mass) | 76/24 | 74/26 | 75/25 | 75/25 | 75/25 | 75/25 | 0/100 | 100/0 | 75/25 | 75/25 | 75/25 | 75/25 |
| PMMA | Mixing amount (parts by mass) | 55 | 2 | 20 | 20 | 20 | 20 | 20 | 20 | 20 | 20 | 20 | 20 |
| | MFR (g/10 min) at a load of 10 kg | 9 | 9 | 9 | 9 | 1 | 25 | 9 | 9 | 9 | 9 | 9 | 9 |
| White inorganic pigment | Mixing amount (parts by mass) | 20 | 20 | 20 | 20 | 20 | 20 | 20 | 20 | 5 | 45 | 20 | 20 |
| Inorganic pigment for toning | Mixing amount (parts by mass) | 3 | 3 | 3 | 3 | 3 | 3 | 3 | 3 | 3 | 3 | 0.003 | 9 |
| Evaluation results | Tensile strength (MPa) | 53 | 41 | 41 | 51 | 51 | 25 | 50 | 30 | 60 | 45 | 51 | 49 |
| | Tensile shear elongation (%) | 400 | 450 | 500 | 300 | 300 | 600 | 440 | 500 | 460 | 440 | 450 | 440 |
| | Tensile shear elongation (%) | 1150 | 980 | 1670 | 1340 | 780 | 1560 | 1100 | 760 | 750 | 1400 | 790 | 1550 |
| | Total reflectance of visible light (%) | 75 | 75 | 75 | 80 | 65 | 75 | 75 | 75 | 50 | 80 | 45 | 77 |

As shown in Tables 1 and 2, in each resin composition of Examples 1 to 14, the number of film defects was significantly reduced compared to that of each resin composition of Comparative Examples 1 to 12 that were out of the scope of the invention. From these results, it was ascertained that the combination use of two types of PVDFs in a pellet form and a powder form each having an MFR within a certain range can provide a polyvinylidene fluoride resin film that has few defects due to poor dispersion, excellent weather resistance, and practical mechanical strength characteristics and is suitable for a back sheet for a solar cell module.

Next, as a second example of the present invention, a polyvinylidene fluoride resin composition using two types of PVDFs having different melt flow characteristics was prepared and film characteristics of the composition was evaluated.

Example 21

(1) Preparation of Pigment for Toning

In a dry mixer, 0.8 kg of black inorganic pigment powder composed of solid solution of oxides of chromium, manganese, and copper, 1.6 kg of brown pigment powder composed of solid solution of oxides of zinc, iron, nickel, and aluminum, and 0.6 kg of blue pigment powder composed of cobalt aluminate were mixed to produce an inorganic pigment for toning. Next, to a mixed solution of 0.3 kg of 0.1% by mass of an aqueous acetic acid solution and 0.3 kg of ethanol, 0.03 kg of n-hexyltrimethoxysilane was added to prepare a silane coupling agent solution. Then, the inorganic pigment for toning was placed in a mixer, and the silane coupling agent solution was added dropwise while stirring the pigment, and mixed. After mixing, the mixture was taken out, dried with a dryer, and pulverized to make a powder. The obtained inorganic pigment for toning had an average particle diameter (median diameter) of 0.3 μm.

(2) Resin Component

For the resin component, the following resins were used. MFR was determined by the measurement method in accordance with JIS K 7210, method A.
<PVDF1>
A polyvinylidene fluoride resin having an MFR (temperature: 230° C., load: 3.8 kg) of 20 g/10 min.
<PVDF2>
A polyvinylidene fluoride resin having an MFR (temperature: 230° C., load: 10 kg) of 20 g/10 min.
<PMMA>
A polymethyl methacrylate resin having an MFR (temperature: 230° C., load: 10 kg) of 9 g/10 min.

(3) Preparation of Resin Composition

First, 3 kg of the inorganic pigment for toning surface-coated with the silane coupling agent and 20 kg of rutile-type crystalline titanium dioxide powder (median diameter: 0.3 μm) as a white inorganic pigment were mixed in a mixer. Next, into a twin screw extruder having a screw diameter of 30 mm and L/D=40 as a kneader for the preparation of the resin composition, the inorganic pigment for toning, PVDF1, PVDF2, and PMMA were fed using corresponding quantitative feeders at a speed corresponding to the compounding ratio of each component and the whole was melted and kneaded. Then, the mixture was passed through a strand die including three holes each having a hole diameter of 3 mm to afford a resin composition in a pellet form.

In the obtained resin composition, PVDF1 was 35 parts by mass (28% by mass), PVDF2 was 45 parts by mass (37% by mass), PMMA was 20 parts by mass (16% by mass), the white inorganic pigment was 20 parts by mass (16% by mass), and the pigment for toning was 3 parts by mass (2% by mass).

(4) Film Formation and Evaluation of Film Defect

The obtained resin composition was extruded with a film formation apparatus that was a single screw extruder having a screw diameter of 40 mm and L/D=30 and attached with a T die having a width of 400 mm at a screw rotation speed of 35 rpm and a barrel temperature of 240° C. to form a film having a film width of 300 mm and an average thickness of 18 μm. For the evaluation of the obtained film defect, the number of defects in an area of 50 m² in the roll up film (width 300 mm×length 2000 m) was evaluated using a defect detector. In the present example, as the evaluation standard of the number of defects, the number of defects having a size of 0.05 mm or more was counted in the film.

(5) Characteristics Evaluation of Film

The tensile strength of the obtained film was determined by the method in accordance with JIS K 7127. In the tensile strength measurement, the sample width was 10 mm and the chuck distance was 40 mm. In addition, the total reflectance of visible light was evaluated in accordance with JIS K 7105.

Examples 22 to 27, Comparative Examples 21 to 26

The evaluations were carried out in the same manner as in Example 21 except that the feed amount of each material component was controlled by a quantitative feeder to change the composition ratio of each component in the resin composition.

The evaluation results of the resin compositions of Examples 21 to 27 are summarized in Table 3, while the evaluation results of the resin compositions of Comparative Examples 21 to 26 are summarized in Table 4.

TABLE 3

| | | | Example 21 | Example 22 | Example 23 | Example 24 | Example 25 | Example 26 | Example 27 |
|---|---|---|---|---|---|---|---|---|---|
| Formulation | PVDF1 (MFR at a load of 3.8 kg = 20 g/10 min) | (parts by mass) | 35 | 20 | 50 | 35 | 20 | 45 | 20 |
| | | (% by mass) | 28 | 16 | 41 | 28 | 28 | 37 | 16 |
| | PVDF2 (MFR at a load of 10 kg = 20 g/10 min) | (parts by mass) | 45 | 45 | 45 | 30 | 75 | 50 | 30 |
| | | (% by mass) | 37 | 37 | 37 | 24 | 61 | 41 | 24 |
| | PMMA (MFR at a load of 10 kg = 9 g/10 min) | (parts by mass) | 20 | 35 | 5 | 35 | 5 | 5 | 50 |
| | | (% by mass) | 16 | 4 | 4 | 28 | 4 | 4 | 41 |
| | White inorganic pigment | (parts by mass) | 20 | 20 | 20 | 20 | 20 | 10 | 20 |
| | Inorganic pigment for toning | (parts by mass) | 3 | 3 | 3 | 3 | 3 | 0.5 | 3 |
| Evaluation results | Tensile strength (MPa) | | 51 | 45 | 55 | 43 | 58 | 55 | 41 |
| | Tensile shear elongation (%) | | 450 | 500 | 400 | 550 | 370 | 390 | 580 |
| | The number of defects having a size of 0.05 mm or more (number/50 m²) | | 200 | 250 | 270 | 150 | 240 | 150 | 180 |
| | Total reflectance of visible light (%) | | 75 | 75 | 75 | 75 | 75 | 65 | 75 |

TABLE 4

| | | | Comparative example 21 | Comparative example 22 | Comparative example 23 | Comparative example 24 | Comparative example 25 | Comparative example 26 |
|---|---|---|---|---|---|---|---|---|
| Formulation | PVDF1 (MFR at a load of 3.8 kg = 20 g/10 min) | (parts by mass) | 10 | 60 | 50 | 15 | 40 | 15 |
| | | (% by mass) | 8 | 49 | 41 | 11 | 33 | 11 |
| | PVDF2 (MFR at a load of 10 kg = 20 g/10 min) | (parts by mass) | 75 | 30 | 25 | 80 | 58 | 30 |
| | | (% by mass) | 61 | 24 | 20 | 65 | 47 | 24 |
| | PMMA (MFR at a load of 10 kg = 9 g/10 min) | (parts by mass) | 20 | 10 | 25 | 5 | 2 | 55 |
| | | (% by mass) | 16 | 8 | 20 | 4 | 2 | 45 |
| | White inorganic pigment | (parts by mass) | 20 | 20 | 20 | 20 | 20 | 20 |
| | Inorganic pigment for toning | (parts by mass) | 3 | 3 | 3 | 3 | 3 | 3 |
| Evaluation results | Tensile strength (MPa) | | 53 | 41 | 41 | 51 | 51 | 25 |
| | Tensile shear elongation (%) | | 400 | 450 | 500 | 300 | 300 | 600 |
| | The number of defects having a size of 0.05 mm or more (number/50 m²) | | 1150 | 980 | 1670 | 1340 | 780 | 1560 |
| | Total reflectance of visible light (%) | | 75 | 75 | 75 | 80 | 65 | 75 |

Examples 28 and 29, Comparative Examples 27 and 28

The evaluations were carried out in the same manner as in Example 21 except that polyvinylidene fluoride resins each having an MFR of 5 g/10 min, 33 g/10 min, 2 g/10 min, or 40 g/10 min at a temperature of 230° C. and a load of 3.8 kg were used as the PVDF1.

Examples 30 and 31, Comparative Examples 29 and 30

The evaluations were carried out in the same manner as in Example 21 except that polyvinylidene fluoride resins each having an MFR of 4 g/10 min, 30 g/10 min, 1 g/10 min, or 35 g/10 min at a temperature of 230° C. and a load of 10 kg were used as the PVDF2.

Examples 32 and 33, Comparative Examples 31 and 32

The evaluations were carried out in the same manner as in Example 21 except that polymethyl methacrylate resins each having an MFR of 2 g/10 min, 20 g/10 min, 1 g/10 min, or 27 g/10 min at a temperature of 230° C. and a load of 10 kg were used as the PMMA.

The evaluation results of the resin compositions of Examples 28 to 33 are summarized in Table 5, while the evaluation results of the resin compositions of Comparative Examples 27 to 32 are summarized in Table 6.

TABLE 5

| | | | | Example 28 | Example 29 | Example 30 | Example 31 | Example 32 | Example 33 |
|---|---|---|---|---|---|---|---|---|---|
| Formulation | PVDF1 | MFR (g/10 min) at a load of 3.8 kg | | 5 | 33 | 20 | 20 | 20 | 20 |
| | | (parts by mass) | | 35 | 35 | 35 | 35 | 35 | 35 |
| | | (% by mass) | | 28 | 28 | 28 | 28 | 28 | 28 |
| | PVDF2 | MFR (g/10 min) at a load of 10 kg | | 20 | 20 | 4 | 30 | 20 | 20 |
| | | (parts by mass) | | 37 | 37 | 37 | 37 | 37 | 37 |
| | | (% by mass) | | 20 | 20 | 20 | 20 | 20 | 20 |
| | PMMA | MFR (g/10 min) at a load of 10 kg | | 9 | 9 | 9 | 9 | 2 | 20 |
| | | (parts by mass) | | 20 | 20 | 20 | 20 | 20 | 20 |
| | | (% by mass) | | 16 | 16 | 16 | 16 | 16 | 16 |
| | White inorganic pigment | (parts by mass) | | 20 | 20 | 20 | 20 | 20 | 20 |
| | Inorganic pigment for toning | (parts by mass) | | 3 | 3 | 3 | 3 | 3 | 3 |
| Evaluation results | | Tensile strength (MPa) | | 53 | 48 | 54 | 49 | 55 | 49 |
| | | Tensile shear elongation (%) | | 450 | 470 | 450 | 460 | 440 | 530 |
| | | The number of defects having a size of 0.05 mm or more (number/50 m$^2$) | | 280 | 250 | 290 | 290 | 290 | 290 |
| | | Total reflectance of visible light (%) | | 75 | 75 | 75 | 75 | 75 | 75 |

TABLE 6

| | | | Comparative example 27 | Comparative example 28 | Comparative example 29 | Comparative example 30 | Comparative example 31 | Comparative example 32 |
|---|---|---|---|---|---|---|---|---|
| Formulation | PVDF1 | MFR (g/10 min) at a load of 3.8 kg | 2 | 40 | 20 | 20 | 20 | 20 |
| | | (parts by mass) | 35 | 35 | 35 | 35 | 35 | 35 |
| | | (% by mass) | 28 | 28 | 28 | 28 | 28 | 28 |
| | PVDF2 | MFR (g/10 min) at a load of 10 kg | 20 | 20 | 1 | 35 | 20 | 20 |
| | | (parts by mass) | 45 | 45 | 45 | 45 | 45 | 45 |
| | | (% by mass) | 37 | 37 | 37 | 37 | 37 | 37 |
| | PMMA | MFR (g/10 min) at a load of 10 kg | 9 | 9 | 9 | 9 | 1 | 27 |
| | | (parts by mass) | 20 | 20 | 20 | 20 | 20 | 20 |
| | | (% by mass) | 16 | 16 | 16 | 16 | 16 | 16 |
| | White inorganic pigment | (parts by mass) | 20 | 20 | 20 | 20 | 20 | 20 |
| | Inorganic pigment for toning | (parts by mass) | 3 | 3 | 3 | 3 | 3 | 3 |
| Evaluation results | | Tensile strength (MPa) | 50 | 30 | 57 | 30 | 30 | 25 |
| | | Tensile shear elongation (%) | 350 | 500 | 200 | 300 | 250 | 300 |
| | | The number of defects having a size of 0.05 mm or more (number/50 m$^2$) | 1730 | 760 | 2170 | 670 | 1240 | 1100 |
| | | Total reflectance of visible light (%) | 75 | 75 | 75 | 75 | 75 | 75 |

Examples 34 to 37, Comparative Examples 33 to 36

The evaluations were carried out in the same manner as in Example 21 except that the compounding ratio of the white inorganic pigment or the inorganic pigment for toning was changed. The evaluation results of Examples 34 to 37 and Comparative Examples 33 to 36 are summarized in Table 7.

TABLE 7

| | | | Example 34 | Example 35 | Example 36 | Example 37 | Comparative example 33 | Comparative example 34 | Comparative example 35 | Comparative example 36 |
|---|---|---|---|---|---|---|---|---|---|---|
| Formulation | PVDF1 (MFR at a load of 3.8 kg = 20 g/10 min) | (parts by mass) (% by mass) | 35 31 | 35 25 | 35 29 | 35 28 | 35 32 | 35 24 | 35 29 | 35 27 |
| | PVDF2 (MFR at a load of 10 kg = 20 g/10 min) | (parts by mass) (% by mass) | 45 40 | 45 32 | 45 38 | 45 36 | 45 42 | 45 30 | 45 38 | 45 35 |
| | PMMA (MFR at a load of 10 kg = 9 g/10 min) | (parts by mass) (% by mass) | 20 18 | 20 14 | 20 16 | 20 16 | 20 19 | 20 14 | 20 17 | 20 16 |
| | White inorganic pigment | (parts by mass) | 10 | 37 | 20 | 20 | 5 | 45 | 20 | 20 |
| | Inorganic pigment for toning | (parts by mass) | 3 | 3 | 0.3 | 6 | 3 | 3 | 0.003 | 9 |
| Evaluation results | Tensile strength (MPa) | | 59 | 44 | 51 | 49 | 59 | 45 | 50 | 47 |
| | Tensile shear elongation (%) | | 450 | 440 | 450 | 450 | 460 | 440 | 450 | 440 |
| | The number of defects having a size of 0.05 mm or more (number/50 m$^2$) | | 230 | 350 | 200 | 350 | 770 | 1390 | 820 | 1610 |
| | Total reflectance of visible light (%) | | 65 | 80 | 60 | 75 | 50 | 80 | 50 | 77 |

As shown in Tables 3 to 7, in each resin composition of Examples 21 to 37, the number of film defects was significantly reduced compared to that of each composition of Comparative Examples 21 to 36 that was out of the scope of the invention. From these results, it was ascertained that the combination use of two types of PVDFs having different melt flow characteristics can provide a polyvinylidene fluoride resin film that has few defects due to poor dispersion, excellent weather resistance, and practical mechanical strength characteristics and is suitable for a back sheet for a solar cell module.

INDUSTRIAL APPLICABILITY

The polyvinylidene fluoride resin composition of the present invention can provide a film that has very few defects due to poor dispersion of the pigments and also has fine weather resistance and fine total reflectance of visible light, and therefore can be expected to be used especially as a back sheet material for a solar cell module and to elongate the lifetime of the solar cell. The film obtained from the resin composition of the present invention has high heat resistance and high insulating characteristics, and therefore can also be used as a protection film in electrical and electronic fields and an interior or exterior protection film for architectures or automobiles.

The invention claimed is:

1. A polyvinylidene fluoride resin composition comprising:
   100 parts by mass of a resin component containing two polyvinylidene fluorides which differ either in average particle size, or in melt flow rates, or both, in a total amount of 50 to 95% by mass and polymethyl methacrylate in an amount of 5 to 50% by mass;
   7 to 40 parts by mass of a white inorganic pigment; and
   0.01 to 7 parts by mass of an inorganic coloring pigment other than the white inorganic pigment for toning;
   at least one of the two polyvinylidene fluorides having an MFR (melt flow rate) of 3 to 35 g/10 min determined at a temperature of 230° C. and a load of 3.8 kg in accordance with JIS K 7210, method A,
   the polymethyl methacrylate having an MFR (melt flow rate) of 2 to 20 g/10 min determined at a temperature of 230° C. and a load of 10 kg in accordance with JIS K 7210, method A.

2. The polyvinylidene fluoride resin composition according to claim 1, wherein one of the two polyvinylidene fluorides is in a pellet form and the other is in a powder form.

3. The polyvinylidene fluoride resin composition according to claim 2, wherein the polyvinylidene fluoride in a pellet form has an average particle diameter (median diameter) of 1 to 6 mm determined by dry sieving test in accordance with JIS K 0069, the polyvinylidene fluoride in a powder form has an average particle diameter (median diameter) of 3 to 30 μm determined with a laser diffractometer in accordance with JIS Z 8825-1, and the pellet form is contained at a ratio of 40 to 97% by mass, and the powder form is contained at a ratio of 3 to 60% by mass, in the whole polyvinylidene fluorides.

4. The polyvinylidene fluoride resin composition according to claim 1, containing the polyvinylidene fluoride having an MFR (melt flow rate) of 3 to 35 g/10 min determined at a temperature of 230° C. and a load of 3.8 kg in accordance with JIS K 7210, method A, and a polyvinylidene fluoride having an MFR (melt flow rate) of 2 to 30 g/10 min determined at a temperature of 230° C. and a load of 10 kg in accordance with JIS K 7210, method A.

5. The polyvinylidene fluoride resin composition according to claim 1, wherein the white inorganic pigment has an average particle diameter (median diameter) of 0.1 to 2 μm determined with a laser diffractometer in accordance with JIS Z 8825-1.

6. The polyvinylidene fluoride resin composition according to claim 1, wherein the inorganic coloring pigment for toning has an average particle diameter (median diameter) of 0.1 to 2 μm determined with a laser diffractometer in accordance with JIS Z 8825-1.

7. A polyvinylidene fluoride resin film obtained by melting and kneading the polyvinylidene fluoride resin composition according to claim 1 at a temperature ranging from 150 to 260° C. and then by extrusion molding the melted and kneaded resin composition.

8. A back sheet for a solar cell module obtained by stacking the polyvinylidene fluoride resin film according to claim 7 and a polyethylene terephthalate resin film.

9. A solar cell module using the back sheet according to claim 8.

\* \* \* \* \*